United States Patent
Gans

(10) Patent No.: US 9,978,437 B2
(45) Date of Patent: May 22, 2018

(54) APPARATUSES AND METHODS FOR DYNAMIC VOLTAGE AND FREQUENCY SWITCHING FOR DYNAMIC RANDOM ACCESS MEMORY

(71) Applicant: Micron Technology, Inc., Boise, ID (US)

(72) Inventor: Dean Gans, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days. days.

(21) Appl. No.: 15/366,198

(22) Filed: Dec. 1, 2016

(65) Prior Publication Data

US 2017/0169875 A1 Jun. 15, 2017

Related U.S. Application Data

(60) Provisional application No. 62/266,506, filed on Dec. 11, 2015.

(51) Int. Cl.
  *G11C 5/14* (2006.01)
  *G11C 11/4074* (2006.01)
  *G11C 11/4076* (2006.01)

(52) U.S. Cl.
  CPC ...... *G11C 11/4074* (2013.01); *G11C 11/4076* (2013.01); *G11C 2207/2227* (2013.01)

(58) Field of Classification Search
  CPC .... G11C 5/14; G11C 5/147; G11C 2207/2227

USPC ................................................ 365/227, 226
See application file for complete search history.

(56) References Cited

U.S. PATENT DOCUMENTS

| | | | |
|---|---|---|---|
| 6,507,900 B1* | 1/2003 | Okajima | G11C 7/1015 365/230.03 |
| 7,028,196 B2* | 4/2006 | Soltis, Jr. | G06F 1/206 711/169 |
| 2011/0029795 A1* | 2/2011 | Miermont | G06F 1/3203 713/322 |
| 2014/0040647 A1* | 2/2014 | Bridges | G06F 1/324 713/322 |
| 2017/0031785 A1* | 2/2017 | Jose | G06F 11/1471 |

OTHER PUBLICATIONS

"JEDEC Standard—Low Power Double Data Rate 4 (LPDDR4)", JEDED Solid State Technology Association, JESD209-4A (Revision of JESD209-4, Aug. 2014), Nov. 2015, pp. 1-268.

* cited by examiner

*Primary Examiner* — Huan Hoang
(74) *Attorney, Agent, or Firm* — Dorsey & Whitney LLP

(57) ABSTRACT

According to one embodiment, an apparatus is disclosed. The apparatus includes a first power supply having a first fixed voltage, a second power supply having a second fixed voltage, a plurality of circuits coupled to the first power supply via a first switch and the second power supply via a second switch, and a power control circuit configured to selectively enable one of the first switch and the second switch responsive to power demand information.

18 Claims, 5 Drawing Sheets

APPARATUSES AND METHODS FOR DYNAMIC VOLTAGE AND FREQUENCY SWITCHING FOR DYNAMIC RANDOM ACCESS MEMORY

CROSS-REFERENCE TO RELATED APPLICATION(S)

This application claims the benefit under 35 U.S.C. § 119 of the earlier filing date of U.S. Provisional Application Ser. No. 62/266,506 filed Dec. 11, 2015, the entire contents of which are hereby incorporated by reference in their entirety for any purpose.

BACKGROUND

Mobile systems, such as laptops, tablets, and mobile phones use dynamic voltage and frequency scaling (DVFS) to maximize efficiency at a range of operating frequencies and voltages. DVFS allows the system to change the supply voltage and clock frequency according to demand. By reducing the supply voltage and/or clock frequency during periods of low demand, power may be conserved and battery life extended. Most, if not all, mobile systems include dynamic random access memory (DRAM). Traditionally, DRAM has not supported DVFS because in mobile systems DRAM operates at relatively low speeds for the majority of applications and supporting DVFS in DRAM can significantly increase the cost and complexity of the DRAM device. However, as mobile capabilities increase, and power management becomes a priority, there is a need for memory devices that can support DVFS to improve power efficiency.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments disclosed herein recognize that supporting DVFS capabilities in memory devices pose several challenges. For example, in many traditional DVFS systems, a single power rail is ramped up and down to different voltages depending on the current need. However, such voltage ramping takes time and the memory device cannot operate while the ramping is taking place. Additionally, memory devices typically have strict internal timing, verification, and test requirements that would need to be considered. Accordingly, supporting traditional DVFS in DRAM would add significant complexity to the memory device. Embodiments disclosed herein provide apparatuses and methods for supporting DVFS capability in memory devices without adding substantial complexity to existing systems.

Figure 1:
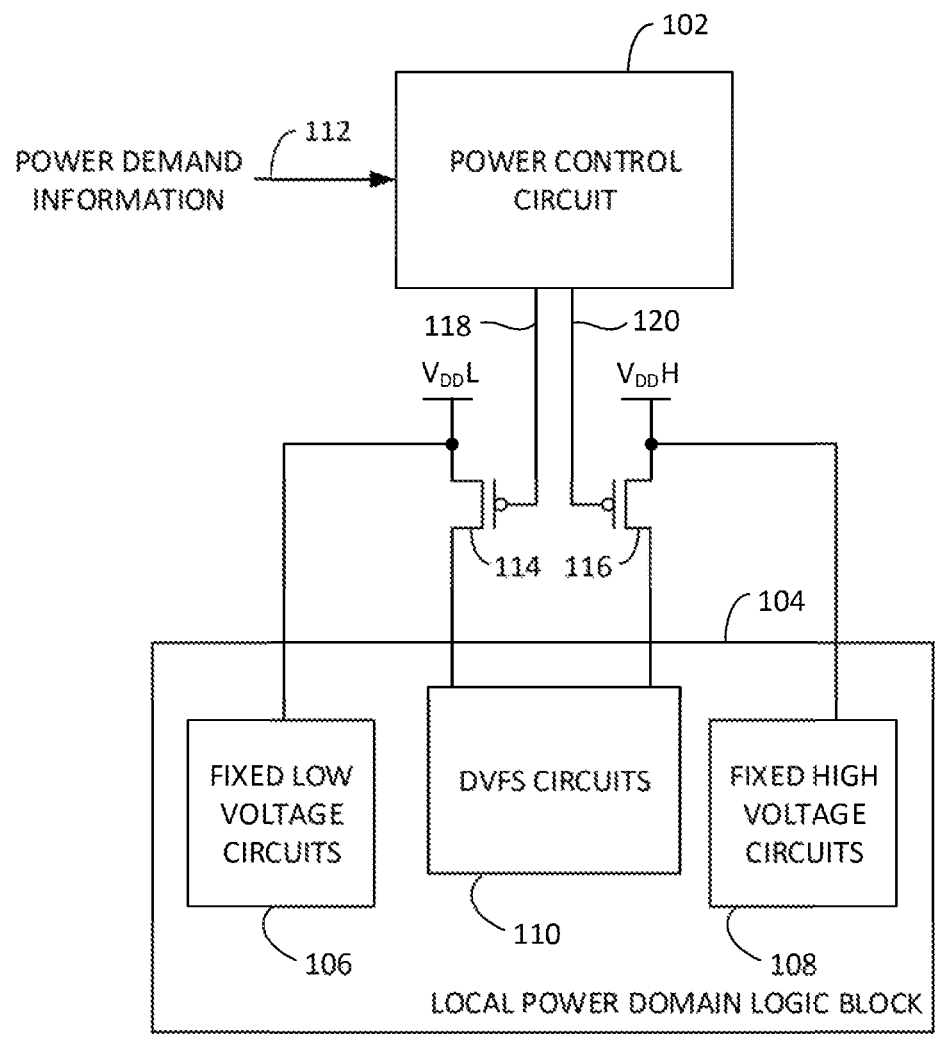
FIG. 1 is a functional block diagram of an apparatus for power management in a memory device, in accordance with an embodiment of the present invention.

FIG. 1 is a functional block diagram of an apparatus for power management in a memory device, in accordance with an embodiment of the present invention. The apparatus generally includes a power control circuit 102 and a local power domain logic block 104. The apparatus further includes a low voltage power supply, $V_{DD}L$, and a high voltage power supply, $V_{DD}H$. The local power domain logic block 104 includes fixed low voltage circuits 106, fixed high voltage circuits 108, and DVFS circuits 110.

The power control circuit 102 includes control logic for selectively enabling and disabling switches to provide the low voltage power supply and the high voltage power supply to the local power domain logic block 104 based on power demand information 112. In some embodiments, the power control circuit 102 may receive the power demand information 112, which may be, for example, latency information or DVFS information specifying a particular voltage power supply. The power demand information 112 may be programmed in a mode register, for example, using a mode register write command provided to a memory device. The power demand information 112 may be received from, or based on information from a system processor, or other device capable of providing instructions and/or information to a memory device, such as the host 10 of FIG. 5. The power demand information 112 may be indicative of, for example, a latency for the memory device, a clock frequency at which the memory device should operate, and/or a supply voltage at which the memory device should operate. In one embodiment, the power demand information 112 indicates a latency as specified by a host (e.g., host 10 of FIG. 5). As known, latency information indicative of a latency may be programmed in the memory device (e.g., via mode register) to control timing aspects of the operation of a memory device. For example, the latency information may set the timing of when data is provided by the memory device relative to when it receives a memory command. An example of a latency, among others, is CAS latency. The latency information may be indicative of a frequency of a clock signal provided to the memory device for operation. Based on the power demand information 112, the power control circuit may determine whether DVFS circuits 110 within the local power domain logic block 104 should operate using the low voltage power supply, $V_{DD}L$ or the high voltage power supply $V_{DD}H$.

The low voltage power supply, $V_{DD}L$, and the high voltage power supply, $V_{DD}H$ may be continuously powered voltage rails. Both the low voltage power supply, $V_{DD}L$, and the high voltage power supply, $V_{DD}H$ may provide continuous, fixed voltages. In one embodiment, the low voltage power supply provides a voltage of about 0.9V and the high voltage power supply provides a voltage of about 1.1V. In other embodiments, other voltages may be used. Each of the low voltage power supply and the high voltage power supply may be coupled to a respective switch that may be selectively enabled or disabled based on a signal from the power control circuit 102. A switch 114 may be used to selectively couple the low voltage power supply, $V_{DD}L$, to the DVFS circuits 110, and a switch 116 may be used to selectively couple the high voltage power supply, $V_{DD}H$, to the DVFS circuits 110. The power control circuit 102 may provide enable signals to the switches 114 and 116 to selectively enable or disable the switches 114 and 116. For example, the power control circuit 102 may provide a low power enable signal 118 to selectively enable and disable the switch 114 in order to couple or decouple the low voltage power supply with the DVFS circuits 110. The power control circuit 102 may also provide a high power enable signal 120 to the switch 116 to selectively enable or disable the switch 116 in order to couple or decouple the high voltage power supply with the DVFS circuits 110. In various embodiments, the low voltage power supply and the high voltage power supply may correspond to a range of operating frequencies and/or latencies.

The local power domain logic block 104 includes fixed low voltage circuits 106, fixed high voltage circuits 108, and DVFS circuits 110. The fixed low voltage circuits 106 include circuits that are unlikely to ever require the high voltage provided by the high voltage power supply. For example, the fixed low voltage circuits 106 may include test logic configured to ensure that the memory device is working properly. The fixed high voltage circuits 103 may include circuits that remain coupled to the high voltage power supply, $V_{DD}H$. In some embodiments, these circuits may be fixed to the high voltage power supply because they are circuits that should not be disabled, even temporarily, to switch between the high voltage power supply and the low voltage power supply. For example, the memory array core voltage and critical timing paths may be included in the fixed high voltage circuits 108. The DVFS circuits 110 may include circuits that may be operated at and switched between either the high voltage power supply or the low voltage power supply. For example, input/output circuits, internal data path circuits, and data path timing circuits, such as power amplifiers and buffers, may be included in the DVFS circuits.

The power control circuit 102 may receive power demand information 112 that indicates a latency at which the memory device is to operate. Based on the specified latency, the power control circuit 102 may determine whether the DVFS circuits 110 should operate using the low voltage power supply or the high voltage power supply. As previously described, the latency may be indicative of a frequency of a clock signal provided to the memory device for operation. In various embodiments, each of the low voltage power supply and the high voltage power supply may be associated with a respective range of clock frequencies or a clock frequency. In one embodiment, the low voltage power supply may be associated with a maximum clock frequency of 800 MHz and the high voltage power supply may be associated with a maximum, clock frequency of 2133 MHZ. That is, the low voltage power supply is used for a lower clock frequency and the high voltage power supply is used for a high clock frequency. Based on the power demand information 112, the power control circuit 102 may provide respective enable signals 118 and 120 (e.g., active low) to the switches 114 and 116 to couple one of the voltage power supplies the DVFS circuits 110 and to decouple the other voltage power supply. For example, if the power control circuit 102 determines that the DVFS circuits 110 should operate using the high voltage power supply, then the power control circuit provides an active high power enable signal 120 to the switch 116 to couple the high voltage power supply to the DVFS circuits 110 to provide the high voltage power to the DVFS circuits 110, and provides an inactive low power enable signal 118 to the switch 114 to decouple the low voltage power supply from the DVFS circuits 110. Accordingly, the low voltage power supply is effectively disconnected from the DVFS circuits 110 and the power supply providing power to the DVFS circuits 110 is the high voltage power supply.

In various embodiments, the determination and enabling of the power supply may be accomplished between about 100 ns and 300 ns. By minimizing the switching time, the need for the memory device to operate during the switch between power supplies may be reduced. Timing concerns may be reduced when the power control circuit 102 changes from the high voltage power supply to the low voltage power supply because such a change occurs when the demand from the host is lower. Those skilled in the art will appreciate that, during a change from the high voltage power supply to the low voltage power supply, extra charge in the DVFS circuits 110 may need to be bled off. This may be accomplished, for example, by coupling the circuits to the low voltage power supply, shunting the DVFS circuits 110 to a voltage (e.g., $V_{SS}$), or simply waiting a time period for the excess charge to bleed of.

Figure 2:
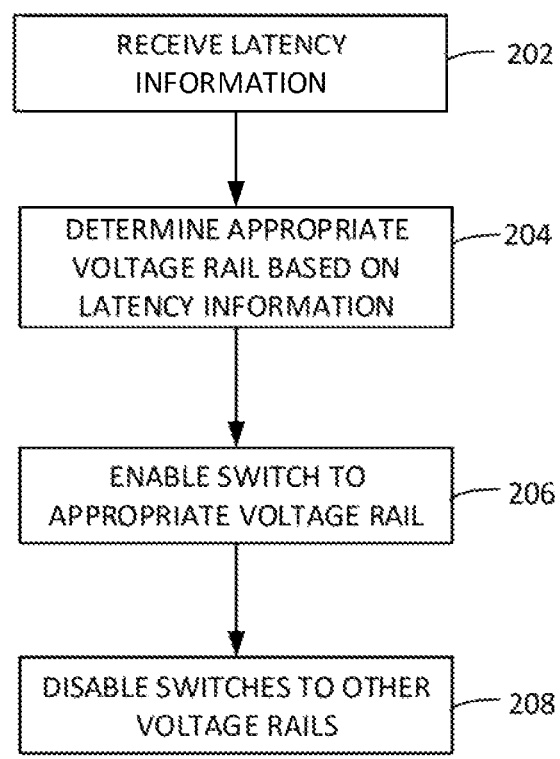
FIG. 2 is a flowchart depicting a method of selecting a voltage for a DVFS enabled memory, in accordance with an embodiment of the present invention.

FIG. 2 is a flowchart depicting a method of selecting a voltage for a DVFS enabled memory. In operation 202, the power control circuit receives latency information. The latency information may be the power demand information 112 discussed above. The latency information may be included in information associated with a mode register write command that may be received from a host device. The mode register write command may be received via a command and/or address bus and may be used to write the latency information to a mode register. Control logic may then provide the latency information to the power control circuit (e.g., power control circuit 102).

In operation 204, the power control circuit determines an appropriate voltage rail for use by DVFS circuits based on the latency information. In various embodiments, the latency information may correspond to an operating frequency provided by the host to the memory device. As discussed above, each voltage rail (e.g., high voltage power supply, $V_{DD}H$, and low voltage power supply, $V_{DD}L$) may correspond to a range of operating frequencies. Based on the operating latency, the power control circuit may determine the operating frequency. Based on the operating frequency, the power control circuit may determine into which range of operating frequencies the specified frequency falls. Finally, the power control circuit may determine the appropriate voltage rail which corresponds to the identified frequency range.

In operation 206, the power control circuit enables the switch to the appropriate voltage rail. In various embodiments, the power control circuit may be coupled to the gates of a plurality of transistors, which act as switches (e.g., switches 114 and 118) between the voltage rails and the DVFS circuits. The power control circuit may provide an enable signal (e.g., low power enable signal 118 and high power enable signal 120) to the gate of the transistor coupled to the appropriate voltage rail identified in operation 204. By enabling the switch, the appropriate voltage rail is connected to the DVFS circuits to provide power to those circuits. For example, if the power control circuit determines that the high voltage power supply is the appropriate voltage rail based on the specified latency, then the power control circuit may provide the high voltage enable signal 120 to the switch 116. In operation 208, the power control circuit disables switches to any other voltage rails. For example, the power control circuit may provide a disable signal to (or simply remove an enable signal (e.g., low power enable signal 118) from) switches between voltage rails that were not identified in operation 204 and the DVFS circuits. By disabling the remaining switches, the power control circuit ensures that only one voltage is coupled to the DVFS circuits at any given point in time. Those skilled in the art will appreciate that operations 206 and 208 may be performed substantially simultaneously or in reverse order as needed to ensure that the memory device functions properly.

Figure 3:
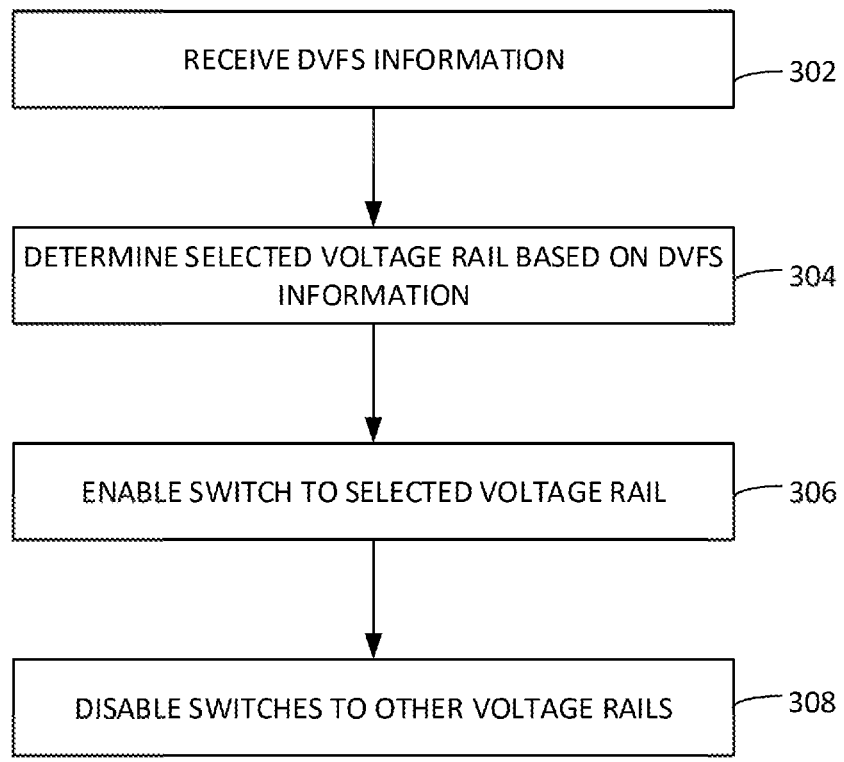
FIG. 3 is a flowchart depicting a method of selecting a voltage for a DVFS enabled memory, in accordance with an embodiment of the present invention.

While the embodiment of FIG. 2 determines the appropriate voltage rail based on latency information provided to the mode register, FIG. 3 is a flowchart depicting a method of selecting a voltage for a DVFS enabled memory using a dedicated bit or bits in the mode register. In operation 302, power control circuit receives DVFS information. In the embodiment of FIG. 3, a mode register may have one or more bits that may be written to by the host to specify a particular voltage rail to be coupled to the DVFS circuits. In the embodiment of FIG. 3, the host may directly specify the appropriate voltage rail on the dedicated DVFS bits, rather than setting the latency and the memory device determining the appropriate voltage rail. Control logic within the memory device may provide the contents of the dedicated DVFS bits to the power control circuit in the form of DVFS information. In operation 304, the power control determines the selected voltage rail based on the DVFS information. The power control circuit may read the DVFS bit in the mode register and, based on the value of the DVFS bit, determine whether the low voltage power supply or the high voltage power supply should be coupled to the DVFS circuit. In operation 306, the power control circuit enables the switch to the selected voltage rail. In operation 308, the power control circuit disables the switches to other voltage rails. Operations 306 and 308 may be performed in substantially the same manner as operations 208 and 210, respectively.

Figure 4:
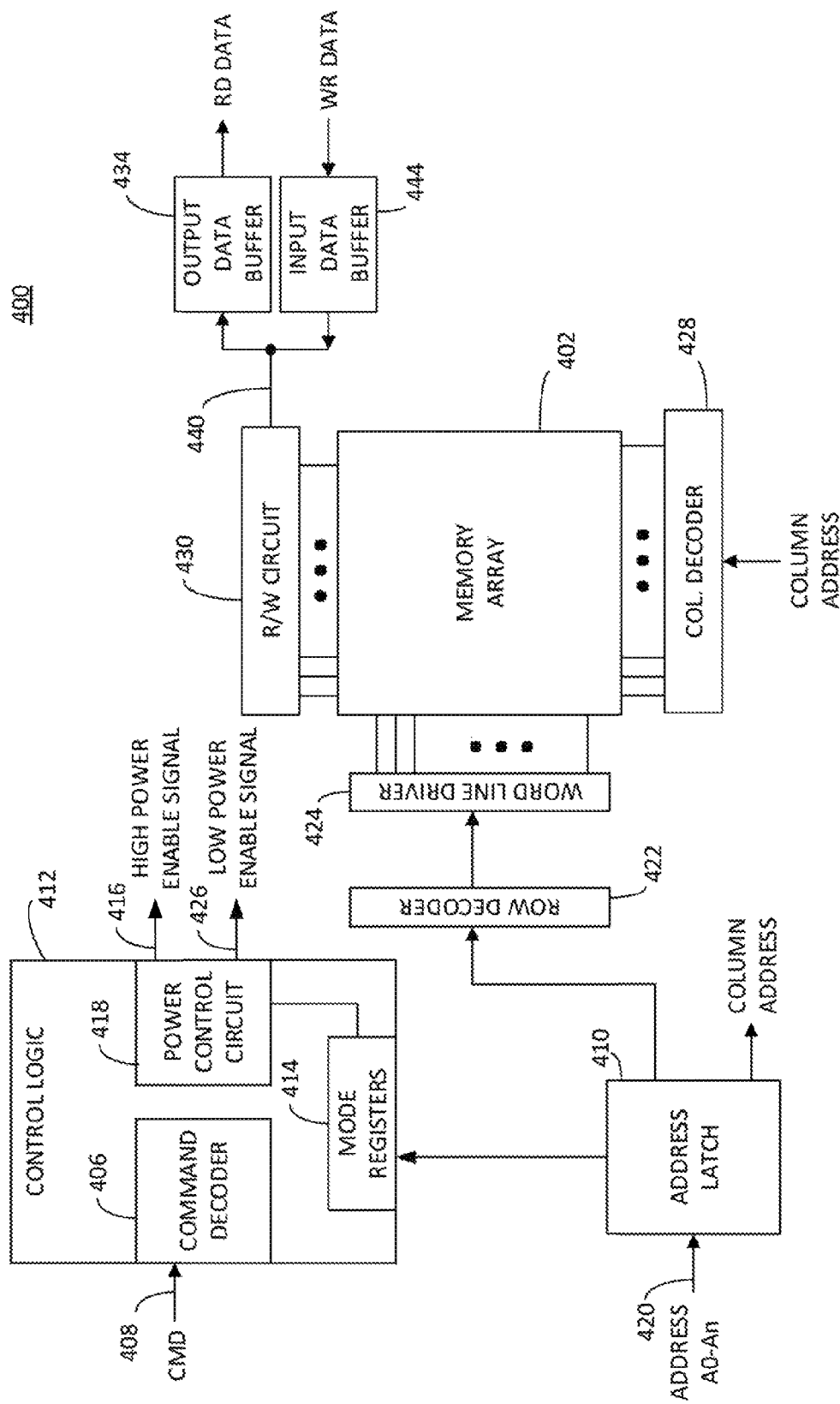
FIG. 4 is a functional block diagram of a memory including a power control circuit, in accordance with an embodiment of the present invention.

FIG. 4 is a block diagram of a memory 400 including a including a power control circuit, according to an embodiment of the invention. The memory 400 may include an array 402 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 400 includes control logic 412, which includes a command decoder 406 a power control circuit 418, and mode registers 414. The command decoder 406 may receive memory commands through a command bus 408 and provide (e.g., generate) corresponding control signals within the memory 400 to carry out various memory operations. For example, the command decoder 406 may respond to memory commands provided to the command bus 408 to perform various operations on the memory array 402. In particular, the command decoder 406 may be used to provide internal control signals to read data from and write data to the memory array 402. Row and column address signals may be provided (e.g., applied) to an address latch 410 in the memory 400 through an address bus 420. The address latch 410 may then provide (e.g., output) a separate column address and a separate row address.

The control logic 412 (including the mode registers 414) may be configured to control determination of the appropriate voltage rail which corresponds to the identified frequency range. For example, when directed by a mode register write to change the frequency set point (FSP) from low to high speed, accordingly the control logic 412 (including the mode registers 414) may determine the appropriate voltage rail (e.g., switch a voltage power supply from a low voltage power supply, VDDL to a high voltage power supply, VDDH). The mode registers 414 may be written to via a mode register write command received on the command bus 408. Latency information specifying a latency for the memory 400 or DVFS information specifying a DVFS voltage power supply may be programmed in the mode registers 414. The control logic 412 may provide the specified latency information or DVFS information to the power control circuit 418 from the mode registers 414. The power control circuit 418 may determine an appropriate voltage power supply based on the specified operating latency and provide high power enable signal 416 and/or low power enable signal 426 to couple a voltage power supply to one or more DVFS circuits. As discussed above, the DVFS circuits may include a variety of circuits including, but not limited to the output data buffer 434, input data buffer 444, and/or the input-output data path 440, and/or data path timing circuits (not shown).

The address latch 410 may provide row and column addresses to a row address decoder 422 and a column address decoder 428, respectively. The address latch 410 may also provide address information to the mode registers 414 for an associated mode register write command. The column address decoder 428 may select bit lines extending through the array 402 corresponding to respective column addresses. The row address decoder 422 may be connected to a word line driver 424 that activates respective rows of memory cells in the array 402 corresponding to received row addresses. The selected data line (e.g., a bit line or bit lines) corresponding to a received column address may be coupled to a read/write circuitry 430 to provide read data to an output data buffer 434 via an input-output data path 340. Write data may be provided to the memory array 402 through an input data buffer 444 and the memory array read/write circuitry 430.

Figure 5:
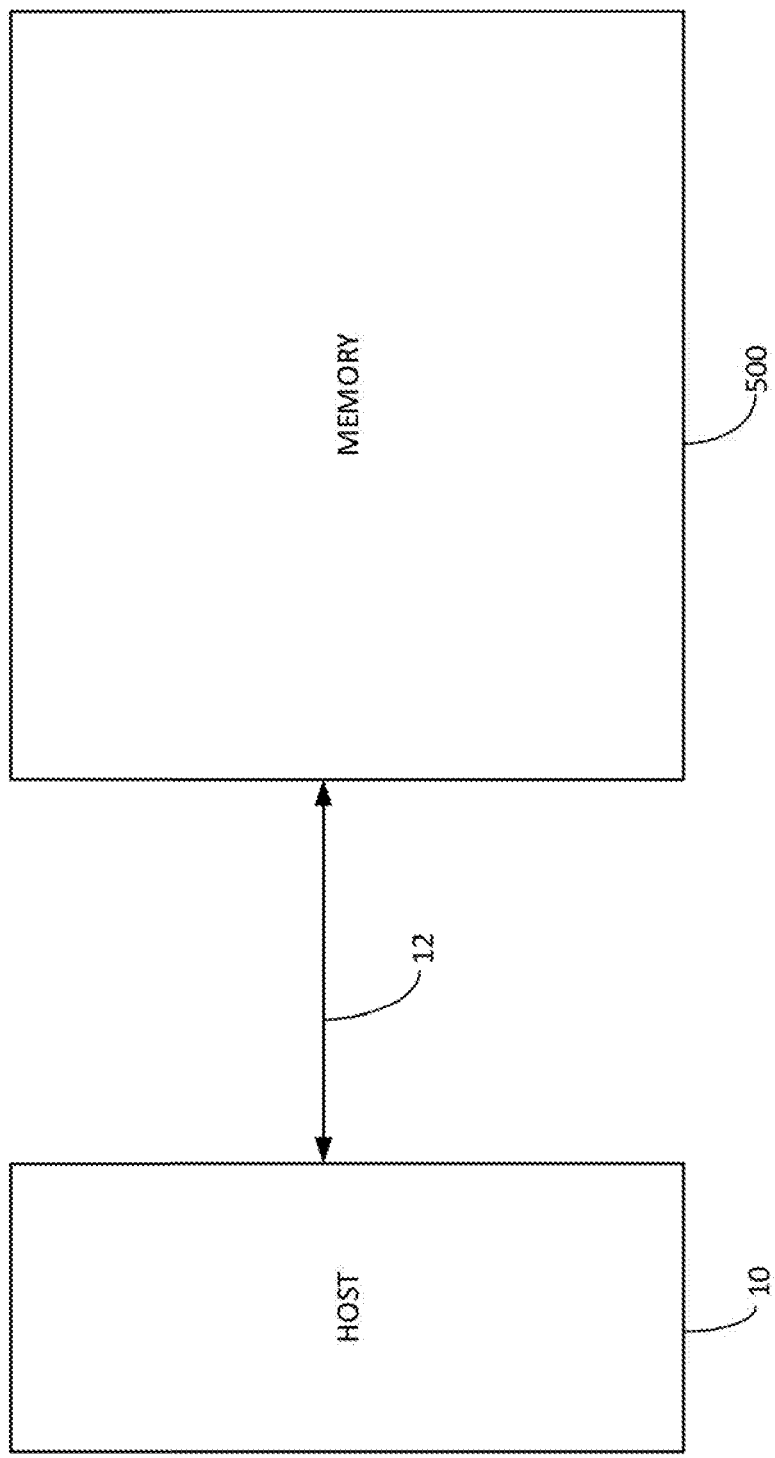
FIG. 5 is a functional block diagram of an apparatus, in accordance with an embodiment of the present invention.

FIG. 5 is a functional block diagram of an apparatus, in accordance with an embodiment of the present invention. The apparatus includes a host 10, a memory 500, and buses 12. The memory 500 may be implemented as the memory 400. The buses 12 may include, for example, a command bus, an address bus, and/or data input/output bus. The host 10 may be, for example, a system processor, as is common in mobile phones, laptop computers, and other electronic devices. As described above, the host 10 may provide latency information or DVFS information to the memory device 500 on the buses 12. For example, the host may provide a mode register write command to the memory 500 on the buses 12. The memory 500 may then selectively couple or decouple one or more voltage power supplies to enable DVFS capability within the memory 500, as described above with respect to FIGS. 1-4.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
a first power supply configured to provide a first fixed voltage;
a second power supply configured to provide a second fixed voltage;
a plurality of circuits coupled to the first power supply via a first switch and the second power supply via a second switch; and
a power control circuit configured to receive operating latency information and provide a low power enable signal to enable the first switch in response to the operating latency information indicating a second operating frequency in a second range of operating frequencies and to provide a high power enable signal to enable the second switch in response to the operating latency information indicating a first operating frequency in a first range of operating frequencies, the first range of operating frequencies greater than the second range of operating frequencies.

2. The apparatus of claim 1, wherein an indication of a change between the first operating frequency and the second operating frequency is provided to the power control circuit by a mode register.

3. The apparatus of claim 1, wherein the second fixed voltage is greater than the first fixed voltage.

4. The apparatus of claim 1, wherein each of the first and the second operating frequency includes information indicative of a frequency at which the apparatus is to operate.

5. The apparatus of claim 4, wherein the second operating frequency is associated with the first power supply and the first operating frequency is associated with the second power supply.

6. The apparatus of claim 1, wherein the plurality of circuits is included in a local power domain logic block, the local power domain logic block further including a first circuit coupled to the first power supply and a second circuit coupled to the second power supply.

7. The apparatus of claim 1, wherein the plurality of circuits comprise input/output circuits.

8. A memory comprising:
a mode register configured to store operating latency information;
a power control circuit configured to receive the operating latency information and to provide one of a high power enable signal and a low power enable signal responsive to the operating latency information;
a first switch configured to receive the low power enable signal and to couple a set of circuits to a first voltage rail responsive to the low power enable signal; and
a second switch configured to receive the high power enable signal and to couple the set of circuits to a second voltage rail responsive to the high power enable signal, the power control circuit configured to provide the high power enable signal responsive to the operating latency information indicating a first operating frequency in a first range of operating frequencies and configured to provide the low power enable signal responsive to the operating latency information indicating a second operating frequency in a second range of operating frequencies, the first range of operating frequencies greater than the second range of operating frequencies.

9. The memory of claim 8, wherein the set of circuits comprises one or more of input/output circuits, internal data path circuits, and data path timing circuits.

10. The memory of claim 8 wherein the power control circuit is configured to detect a change in the operating latency information from indicating the first operating frequency in the first range of operating frequencies to indicating the operating frequency in the second range of operating frequencies, and vice versa, and provide one of the high power enable signal and the low power enable signal responsive to the changed operating latency information.

11. The memory of claim 8, wherein the first voltage rail is configured to provide a first fixed voltage and wherein the second voltage rail is configured to provide a second fixed voltage.

12. The memory of claim 11, further comprising a set of fixed low voltage circuits coupled to the first voltage rail.

13. The memory of claim 12, further comprising a set of fixed high voltage circuits coupled to the second voltage rail.

14. The memory of claim 8, wherein the low power enable signal is associated with a first maximum operating frequency for the memory and the high power enable signal is associated with a second maximum operating frequency for the memory.

15. A method comprising:
receiving, at a power control circuit, operating latency information associated with a memory;
responsive to the operating latency information having a first value indicative of a second operating frequency in a second range of operating frequencies, coupling one or more circuits of the memory to a first fixed voltage; and
responsive to the operating latency information having a second value indicative of a first operating frequency in a first range of operating frequencies, coupling the one or more circuits of the memory to a second fixed voltage, wherein the first range of operating frequencies is greater than the second range of operating frequencies.

16. The method of claim 15, wherein the operating latency information is received from a mode register.

17. The method of claim 15, wherein the operating latency information is indicative of a frequency of a clock signal provided to the memory.

18. The method of claim 15, further comprising:
detecting a change in the operating latency information from the first value to the second value; and
responsive to detecting the change in the operating latency information from the first value to the second value, decoupling the one or more circuits from the first fixed voltage and coupling the one or more circuits to the second fixed voltage.

* * * * *